US009515622B2

(12) United States Patent
Nentwig et al.

(10) Patent No.: US 9,515,622 B2
(45) Date of Patent: Dec. 6, 2016

(54) RECONFIGURABLE BIAS AND SUPPLY DRIVERS FOR RADIO FREQUENCY POWER AMPLIFIERS

(71) Applicant: Nokia Corporation, Espoo (FI)

(72) Inventors: Markus Nentwig, Helsinki (FI); Mikko Kaltiokallio, Espoo (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/581,890

(22) Filed: Dec. 23, 2014

(65) Prior Publication Data

US 2016/0181995 A1 Jun. 23, 2016

(51) Int. Cl.
| H03F 3/68 | (2006.01) |
| H03F 3/21 | (2006.01) |
| H03F 3/19 | (2006.01) |
| H03F 1/02 | (2006.01) |
| H03F 3/195 | (2006.01) |

(Continued)

(52) U.S. Cl.
CPC ............ *H03F 3/211* (2013.01); *H03F 1/0222* (2013.01); *H03F 1/0266* (2013.01); *H03F 1/0277* (2013.01); *H03F 3/19* (2013.01); *H03F 3/195* (2013.01); *H03F 3/245* (2013.01); *H03F 3/68* (2013.01); *H03F 3/72* (2013.01); *H03F 2200/03* (2013.01); *H03F 2200/102* (2013.01); *H03F 2200/105* (2013.01); *H03F 2200/111* (2013.01); *H03F 2200/27* (2013.01); *H03F 2200/411* (2013.01); *H03F 2200/429* (2013.01); *H03F 2200/451* (2013.01); *H03F 2200/507* (2013.01); *H03F 2203/21196* (2013.01); *H03F 2203/7206* (2013.01); *H03F 2203/7209* (2013.01); *H03F 2203/7227* (2013.01); *H03F 2203/7236* (2013.01)

(58) Field of Classification Search
CPC ........ H03F 3/211; H03F 1/0277; H03F 3/19; H03F 2200/102; H03F 2200/105; H03F 2200/451; H03F 2203/21196
USPC ....... 330/11, 51, 73, 84, 114, 123–127, 130, 330/134–136, 147, 148, 151, 199, 254, 261, 330/267, 273, 285, 295–297, 124 D, 124 R See application file for complete search history.

(56) References Cited

U.S. PATENT DOCUMENTS 6,025,754 A    2/2000   Czora
6,157,253 A *  12/2000  Sigmon ................. H03F 1/0222
                                                          330/10

(Continued)

OTHER PUBLICATIONS

International Search Report for International Application No. PCT/FI2015/050906. Issued Apr. 7, 2016. (11 pages).

*Primary Examiner* — Steven J Mottola
*Assistant Examiner* — Hafizur Rahman
(74) *Attorney, Agent, or Firm* — Mintz Levin Cohn Ferris Glovsky and Popco, P.C.

(57) ABSTRACT

In some example embodiments, there is provided an apparatus. The apparatus may include a direct current voltage source and/or an alternating current voltage source to track a power envelope of a radio frequency signal. The apparatus may further include first and second power amplifiers with bias voltage inputs and a supply voltage inputs, and a switch matrix. The first input may be coupled to the direct current voltage source, the second input may be coupled to the alternating current voltage source. The outputs may be coupled to the bias and supply inputs to the power amplifiers. The switch matrix may enable activation of the first power amplifier, the second power amplifier, both the first and second power amplifiers, or neither power amplifier.

21 Claims, 6 Drawing Sheets

(51) Int. Cl.
  *H03F 3/24*   (2006.01)
  *H03F 3/72*   (2006.01)

(56)  References Cited

U.S. PATENT DOCUMENTS 8,774,065  B2    7/2014  Khlat et al.
  8,981,846  B2 *  3/2015  Wimpenny ........... H03F 1/0227
                                                       330/129
  2008/0278136  A1    11/2008  Murtojarvi
  2011/0298545  A1 *  12/2011  Morimoto ............ H03F 1/0216
                                                       330/296
  2012/0146731  A1 *  6/2012   Khesbak ............... H03F 1/0222
                                                       330/295
  2012/0214431  A1    8/2012   Kanno et al.
  2013/0135043  A1    5/2013   Hietala et al.
  2014/0184335  A1 *  7/2014   Nobbe ................. H03F 1/0227
                                                       330/291

* cited by examiner

RECONFIGURABLE BIAS AND SUPPLY DRIVERS FOR RADIO FREQUENCY POWER AMPLIFIERS

FIELD

The subject matter described herein relates to radio frequency power amplifiers.

BACKGROUND

Many modern computing and communications devices are mobile. These mobile terminals include a wide variety of consumer and industrial products including cell phones, handheld computing devices, laptops, printers, and the like. Wireless infrastructure systems such as cellular systems and other wireless access systems use a wide array of frequencies to accommodate the data throughput requirements of the many simultaneous users of the system. To take advantage of the multiple frequencies supported by one or multiple wireless access networks, the mobile terminal may operate on multiple frequencies. The range of frequencies may be wide which may require multiple power amplifiers in the mobile terminal. Power efficient wireless access electronics including power amplifiers may help preserve good battery life of mobile terminals.

SUMMARY

In some example embodiments, there is provided an apparatus. The apparatus may include a direct current voltage source. The apparatus may include an alternating current voltage source to track a power envelope of a first radio frequency signal or a second radio frequency signal. The apparatus may further include a first power amplifier to amplify the first radio frequency signal, wherein the first power amplifier has a first bias voltage input and a first supply voltage input. The apparatus may include a second power amplifier to amplify the second radio frequency signal, wherein the second power amplifier has a second bias voltage input and a second supply voltage input. The apparatus may further include a switch matrix including a first input, a second input, a first output, a second output, a third output, and a fourth output. The first input may be coupled to the direct current voltage source, the second input may be coupled to the alternating current voltage source. The first output may be coupled to the first bias voltage input, the second output may be coupled to the second bias voltage input, the third output may be coupled to the first supply voltage input, and the fourth output may be coupled to the second supply voltage input. A configuration of the switch matrix may enable activation of the first power amplifier, may enable activation of the second power amplifier, may enable activation of both the first and second power amplifiers, or may enable activation of neither power amplifier.

In some variations, one or more of the features disclosed herein including the following features can optionally be included in any feasible combination. The power consumption of the apparatus may be reduced when the switch matrix is configured to connect the alternating current voltage source to the first supply voltage input of the first power amplifier. The alternating current voltage source may track the power envelope or the average power of the first radio frequency signal amplified by the first power amplifier or the second radio frequency signal amplified by the second power amplifier. The power consumption of the apparatus may be reduced when the switch matrix is configured to not connect one or more of the bias voltage input and the supply voltage input of the first or second power amplifier to either the alternating current voltage source or the direct current voltage source. The switch matrix may be configured to connect the bias voltage input of the first power amplifier and the bias voltage input of the second power amplifier to the direct current voltage source. The switch matrix may be configured to connect the bias voltage input of the first power amplifier to the alternating current voltage source. The first supply voltage input or the second supply voltage input may control a power supply for the first power amplifier or the second power amplifier. The power supply may include at least one of an envelope tracking modulator, a switched mode direct current to direct current converter, or a low-dropout linear voltage regulator. The switch matrix may be configured based on a bandwidth, a contiguous or a non-contiguous multicarrier configuration, a transmit power, an operating mode, a modulation and coding configuration, or a signal reflection coefficient of a transmission antenna. The alternating current voltage source may include a filter, wherein the filter may be configured to a wide bandwidth when the switch matrix connects the second input to the first output, and the filter may be configured to a narrow bandwidth when the switch matrix connects the second input to the third output.

The above-noted aspects and features may be implemented in systems, apparatuses, methods, and/or computer-readable media depending on the desired configuration. The details of one or more variations of the subject matter described herein are set forth in the accompanying drawings and the description below. Features and advantages of the subject matter described herein will be apparent from the description and drawings, and from the claims. In some exemplary embodiments, one of more variations may be made as well as described in the detailed description below and/or as described in the following features.

Figure 1:
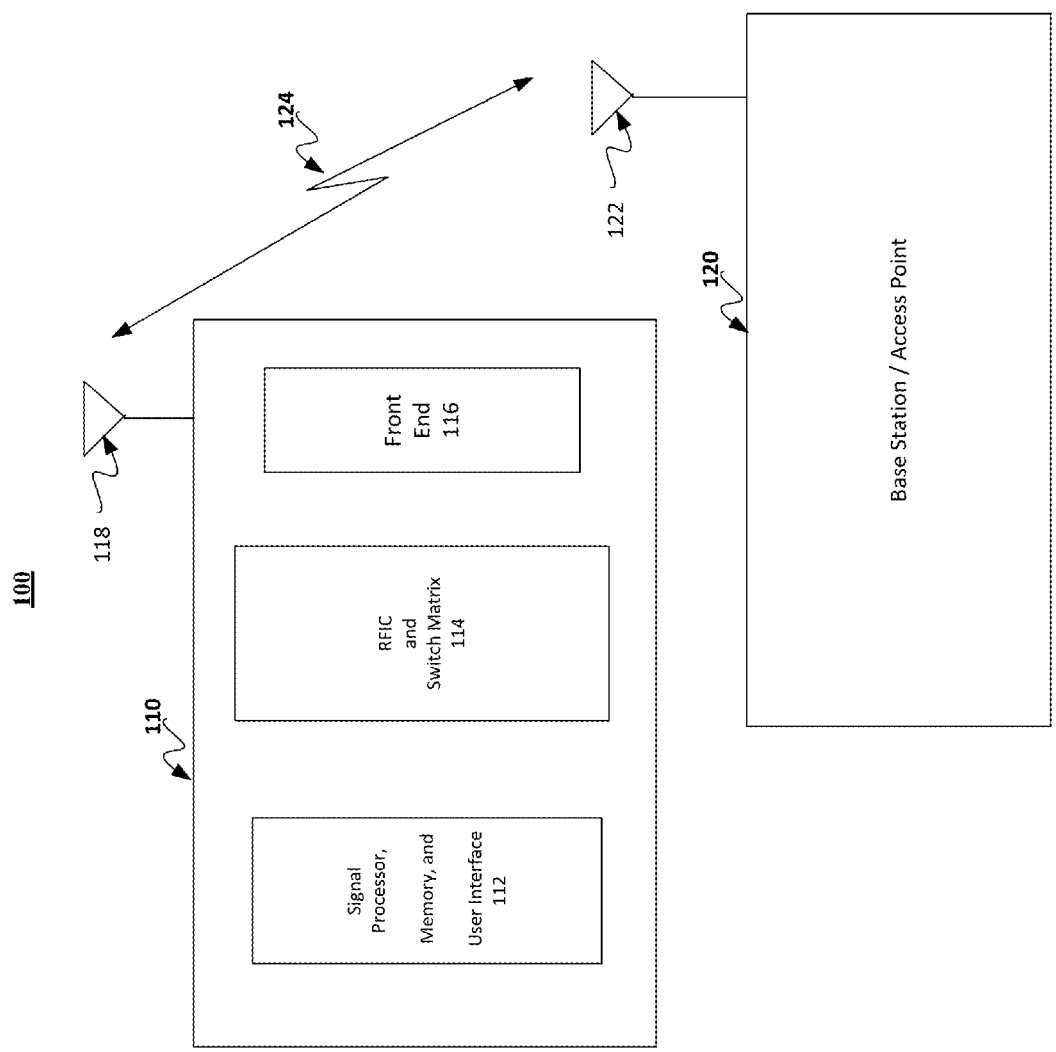
FIG. 1 depicts an example of a wireless communications system, in accordance with some example embodiments.

Like labels are used to refer to the same or similar items in the drawings.

DETAILED DESCRIPTION

Amplifiers including power amplifiers are used in wireless terminals. For example, power amplifiers are used in cell phones and smartphones in 2G/3G/4G/5G cellular systems, WiFi devices, and radios of most other wireless access technologies. Power amplifiers are also used in many computing devices incorporating wireless access technologies such as desktop computers, laptop computers, tablet computers, netbooks, and other types of computers. Many wireless access technologies include communications protocols that use multiple frequency bands.

In some example embodiments, a wireless terminal may transmit on multiple frequency bands simultaneously according to a wireless protocol. A different power amplifier may be associated with each frequency band. In some example embodiments, a power amplifier may operate at high power efficiency when a bias voltage applied to the power amplifier and a supply voltage applied to the power amplifier are controlled. Depending on the wireless protocol, the bias voltage and/or supply voltage may each be fixed, vary slowly, or may follow a power envelope of a signal being amplified by the power amplifier. In some example embodiments, a switch matrix may connect one or more voltage sources to bias and supply voltage inputs of one or more power amplifiers. In some example embodiments, reconfiguring the switch matrix may accommodate different protocols and/or bands by connecting different voltage sources to each of the bias and supply voltage inputs of the one or more amplifiers. For example, at some time after being configured for a first wireless protocol, the switch matrix may be reconfigured to accommodate a second wireless protocol. In some example embodiments, the reconfigurable switch matrix may improve the power efficiency of the transmitter in the mobile terminal and may accommodate a wider array of wireless communications protocols than bias and supply voltages that are not reconfigurable.

FIG. 1 depicts an example of a wireless communications system, in accordance with some example embodiments. Mobile terminal 110 may include front end 116, radio frequency integrated circuit (RFIC) and switch matrix 114, processor, memory, and user interface 112 (also referred to herein as processor 112), and antenna 118. Mobile terminal 110 may communicate via communications channel 124 with base station/access point 120 in at least one band using at least one wireless communications protocol.

Front end 116 may include one or more radio frequency power amplifiers and corresponding bias and supply voltage inputs. A radio frequency power amplifier may be designed to operate in a specific frequency band. The band may start at a lower frequency and end at an upper frequency. The power amplifier may operate over the entire frequency range between the lower and upper frequencies simultaneously where the bandwidth may be the difference between the upper and lower frequencies, or the power amplifier may operate between the lower and upper frequencies with a bandwidth smaller than the difference between the upper and lower frequencies. As an illustrative example, a power amplifier may operate between a lower frequency of 1.7 GHz (Gigahertz) and an upper frequency of 2.0 GHz with a bandwidth of 300 MHz (Megahertz) or may operate with a smaller bandwidth. Another power amplifier may operate between 700 MHz and 900 MHz. A power amplifier may operate in any other band between frequencies of 1 KHz (Kilohertz) and 1 THz (Terahertz) and may operate over any bandwidth. Power efficiency may degrade with wider bandwidths and at higher frequencies.

Front end 116 may include one or more power amplifiers with corresponding bias and supply voltage inputs for each power amplifier. For example, front end 116 may include a first power amplifier operating between 1.7 GHz and 2.0 GHz and a second power amplifier operating between 700 and 900 MHz. The first power amplifier may include a corresponding first bias voltage input and a first supply voltage input. In some implementations, the first bias voltage input may control a bias voltage to one or more transistors in the first power amplifier. The first supply voltage input may control a power supply voltage to the first power amplifier. In some example embodiments, the second power amplifier may have second bias voltage input and second supply voltage input that may be different from the first power amplifier. In some example embodiments, controlling the bias voltage and supply voltage of a power amplifier may control the output power of the power amplifier and control the power efficiency of the power amplifier.

Radio frequency integrated circuit (RFIC) and switch matrix 114 may include analog and/or digital signal processing functions to produce radio frequency signals for the power amplifiers to amplify and later transmit via antenna 118. In some example embodiments, RFIC and switch matrix 114 may also include one or more voltage sources that may be connected through a reconfigurable switch matrix to the bias and supply voltage inputs of the at least one power amplifier in front end 116. The switch matrix may be configured or reconfigured, by a processor or circuitry in processor 112 to select connections between a plurality of voltage sources and a plurality of bias and supply voltage inputs. In some example embodiments, the switch matrix may be configurable to connect any input to any output. For example, the switch matrix may be configured to connect any of the voltage sources to the bias voltage input for a first power amplifier. The switch matrix may also be configured to connect the same voltage source to the bias voltage input of a second power amplifier. The switch matrix may also be configured to connect the same or a different voltage source to one or more of the supply voltage inputs of the first and second power amplifiers. The switch matrix may be reconfigured via control circuitry, control messages, and/or signals from a processor 112 or circuitry in processor 112. In this way, the source voltages may be connected to the bias voltage and supply voltage inputs of the power amplifier(s) in front end 116. The connections may be configured and/or reconfigured from time to time by the control circuitry and/or processor 112 or other control signal.

Mobile terminal 110 includes signal processor, memory, and user interface 112 (also referred to as processor 112). Processor 112 may include at least one processor such as a data processor and/or a digital signal processor, at least one memory to support the at least one processor, and a user interface. The user interface may include a display, keyboard, and/or other user interface device. Processor 112 may include digital interfaces to RFIC and switch matrix 114 and/or front end 116 for passing control signals between 112, 114, and/or 116. Mobile terminal 110 may also include antenna 118 to transmit one or more signals generated by the power amplifiers in front end 116.

Mobile terminal 110 may communicate via communications channel 124 with base station/access point 120 in at least one band using at least one protocol. For example, base station/access point 120 may include a 2G/3G/4G/5G cellular base station, WiFi access point, WiMax access point, or access point for any other wireless access network. Base station/access point 120 may communicate through channel 124 to mobile terminal 110 via antennas 122 and 118. Channel 124 may include transmission through any media such as air, space, and/or through any other material or combination of media/materials. Although FIG. 1 depicts RFIC 114 and front end 116 included in mobile terminal 110, an RFIC and switch matrix 114 and front end 116 consistent with the subject matter herein may be included in base station/access point 120.

Figure 2A:
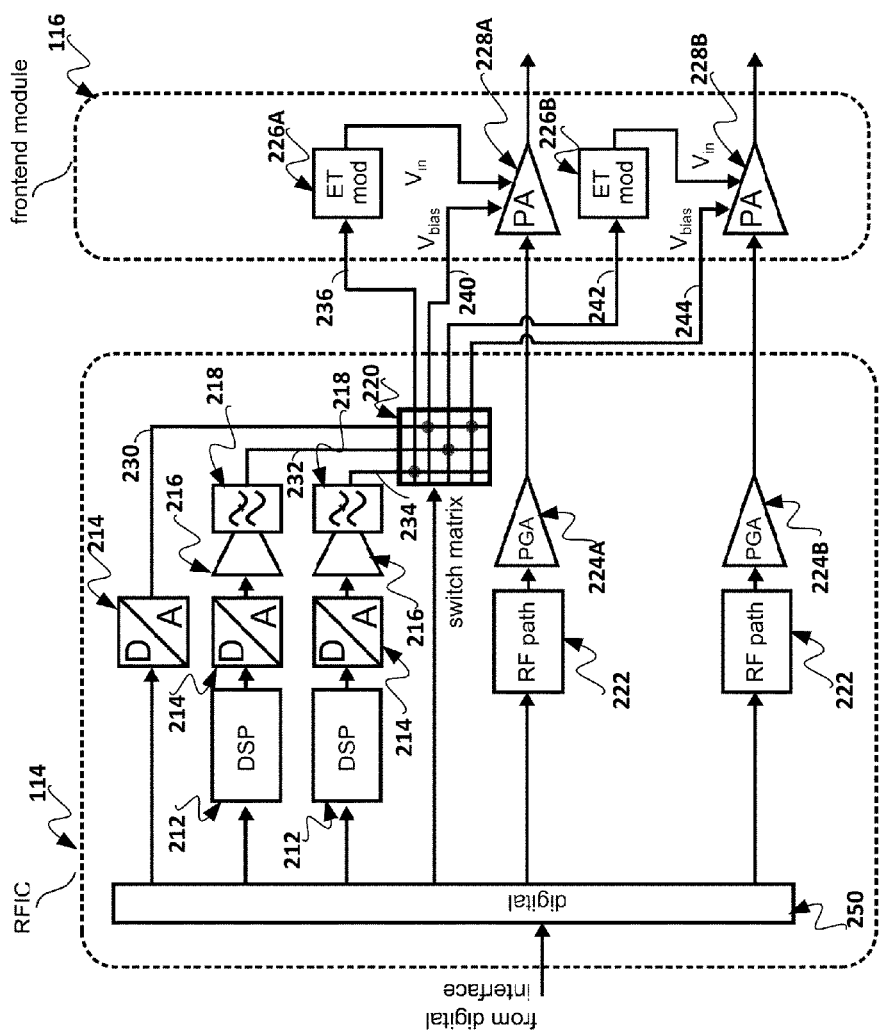
FIG. 2A depicts an example of an apparatus, in accordance with some example embodiments.

FIG. 2A depicts an example of an apparatus, in accordance with some example embodiments. Front end 116 may include one or more power amplifiers with corresponding bias voltage inputs, and supply voltage inputs that may include envelope tracking circuitry and/or processing. RFIC and switch matrix 114 may include one or more voltage sources, signal conditioning/processing for the signal(s) to be amplified by one or more power amplifiers, and/or a digital interface. The description of FIG. 2A also refers to FIG. 1.

In some example embodiments, use of a wireless protocol may cause the mobile terminal to operate in multiple bands simultaneously or to switch quickly between bands. Front end 116 may include one or more power amplifiers with corresponding bias voltage inputs and supply voltage inputs. In some example embodiments, different power amplifiers in front end 116 may be used to amplify the signals in the different bands. For example, a first power amplifier in the mobile terminal may operate in a band between 1.7-2.0 GHz and a second power amplifier in the mobile terminal may operate in a band between 700-900 MHz. In some example embodiments, both power amplifiers may operate simultaneously. In some example embodiments, different power amplifiers may operate in the same band but may be used at different times to provide different ranges of power output.

The first power amplifier 228A in FIG. 2A may have a first bias voltage input 240 that determines a bias voltage on one or more transistors in the first power amplifier 228A. The first power amplifier 228A may have a first supply voltage input 236 that determines a supply voltage in the first power amplifier 228A. In some example embodiments, the supply voltage input 236 may cause envelope tracker 226A to generate the supply voltage for power amplifier 228A. In some example embodiments, the envelope tracker 226A may be a voltage controlled voltage source. By controlling the bias voltage 240 and supply voltage at 236, the radio frequency output power of power amplifier 228A and the efficiency of power amplifier 228A may be controlled.

The second power amplifier 228B may have a second bias voltage input 244 that determines a bias voltage on one or more transistors in the second power amplifier 228B. The second power amplifier 228B may have a second supply voltage input 242 that determines a supply voltage in the second power amplifier 228B. In some example embodiments, the supply voltage input 242 may cause an envelope tracker 226B to generate the supply voltage for power amplifier 228B. In some example embodiments, the envelope tracker 226B may be a voltage controlled voltage source. By controlling the bias voltage 244 and supply voltage at 242, the radio frequency output power of power amplifier 228B and the efficiency of power amplifier 228B may be controlled.

RFIC and switch matrix 114 may include one or more voltage sources. The voltage sources may include one or more direct current (DC) voltage sources such as DC voltage source 230. The DC voltage may be produced by digital-to-analog converter 214. The direct current voltage may be controlled by a digital input value to digital to analog converter 214. The digital value may be changed from time to time through digital interface 250. The voltage sources may include one or more alternating current (AC) voltage sources such as AC voltage sources 232 and 234. For example, the AC voltage sources may be generated by digital-to-analog converters 214 provided with digital values representative of the AC voltage sources from digital signal processors 212. The outputs of the digital to analog converters may be adjusted in amplitude by variable gain amplifiers 216 and filtered by filters 218. In some example embodiments, the voltage out of one or more of AC voltage sources 232/234 may be generated to track a power envelope of a radio frequency signal amplified by a power amplifier. For example, a signal amplified by a power amplifier may not have a constant power envelope due to a the modulation being used or other effects. As the power in the signal being amplified by the power amplifier changes, the AC voltage source 232/234 may track the change. In some example embodiments, the supply voltage input and/or bias voltage input of a power amplifier may be adjusted according to other changes in the power amplifier or the communications channel. For example, the bias voltage input/supply voltage input may track multipath fading due to the communications channel 124. Although the foregoing describes RFIC and switch matrix 114 as including voltage sources at 114 and voltage inputs at 116, the sources may include current sources in addition to, or instead of, voltage sources and the inputs may be current inputs.

RFIC and switch matrix 114 may include switch matrix 220. The switch matrix may be represented by a quantity of input lines and the same quantity, or a different quantity, of output lines. For example, switch matrix 220 may have three input lines and four output lines as shown in FIG. 2A. Any other number of input lines and output lines may also be used. In some example embodiments, each input line may be configured to be connected to any output line and each input line may be configured to be connected to more than one output line. In the example of FIG. 2A, input line 234 from one of the AC sources may be configured to be connected to output 236 as supply voltage input to power amplifier 228A. Input 234 may also be configured to be connected to 240, 242, or 244, or any combination of 236, 240, 242, and 244. Inputs 232 and 230 may also be configured/reconfigured to be connected to any of the outputs 236, 240, 242, and/or 244. In the example of FIG. 2A, AC voltage source 232 is configured to be connected to supply voltage input 242 of power amplifier 228B, and DC source 230 is configured to be connected to bias voltage inputs 240 and 244 of power amplifiers 228A and 228B. Switch matrix 220 may be configured or reconfigured by a processor and/or circuitry in 114 and/or processor 112 to select or change the connections between the voltage source outputs and the bias and supply voltage inputs. The switch matrix 220 may be reconfigured via control circuitry, control messages, and/or signals from a processor such as a processor in 112 or circuitry in processor 112. In this way, the source voltages may be configured to be connected to the bias voltage inputs and supply voltage inputs of power amplifiers 228A and 228B.

Switch matrix 220 may include an integrated switch matrix, individual switches, or a combination of integrated switches and individual switches may be used. The switches may be implemented in one or more semiconductor devices and/or circuits. One or more of the switches may include mechanical switches such as switches implemented as microelectromechanical systems (MEMS). Any other type of switch or switch circuit may also be used.

Continuing the example of FIG. 2A, the wireless protocol being used by the mobile terminal may use both power amplifiers 228A and 228B. The selection of the voltage sources for the bias and supply voltages of power amplifiers 228A and 228B may be performed based on the communications protocol, frequency band, and the power efficiency resulting from the connection selections in switch matrix 220. In the example of FIG. 2A, the bias voltage inputs of power amplifier 228A at 240 and 228B at 244 may be connected through switch matrix 220 to DC voltage source 230, the supply voltage input 236 of power amplifier 228A may be connected to AC voltage source 234, and the supply voltage input 242 of power amplifier 228B may be connected to AC source 232. AC voltage source 232 may follow a power envelope of the radio frequency signal passed from variable gain amplifier 224B to power amplifier 228B. AC voltage source 234 may follow a power envelope of the radio frequency signal passed from variable gain amplifier 224A to power amplifier 228A. Alternatively, one of the supply voltages may track another communications parameter such as multipath fading. In the example of FIG. 2A, AC voltage source 232 connected to the supply voltage input 242 of power amplifier 228B may be generated to track a power envelope of the radio frequency signal passed from variable gain amplifier 224B to power amplifier 228B.

RFIC and switch matrix 114 may include signal conditioning and/or processing of the radio frequency signal being provided to a power amplifier such as power amplifier 228A or 228B. For example, analog and/or digital signal processing may be included in 114 such as radio frequency signal processing 222 and variable gain amplifiers 224A and 224B. Digital interface 250 may be included to allow digital data and control information to be passed to/from processor 112 from/to RFIC and switch matrix 114. Digital interface 250 may provide data/control to/from front end 116 as well.

Figure 2B:
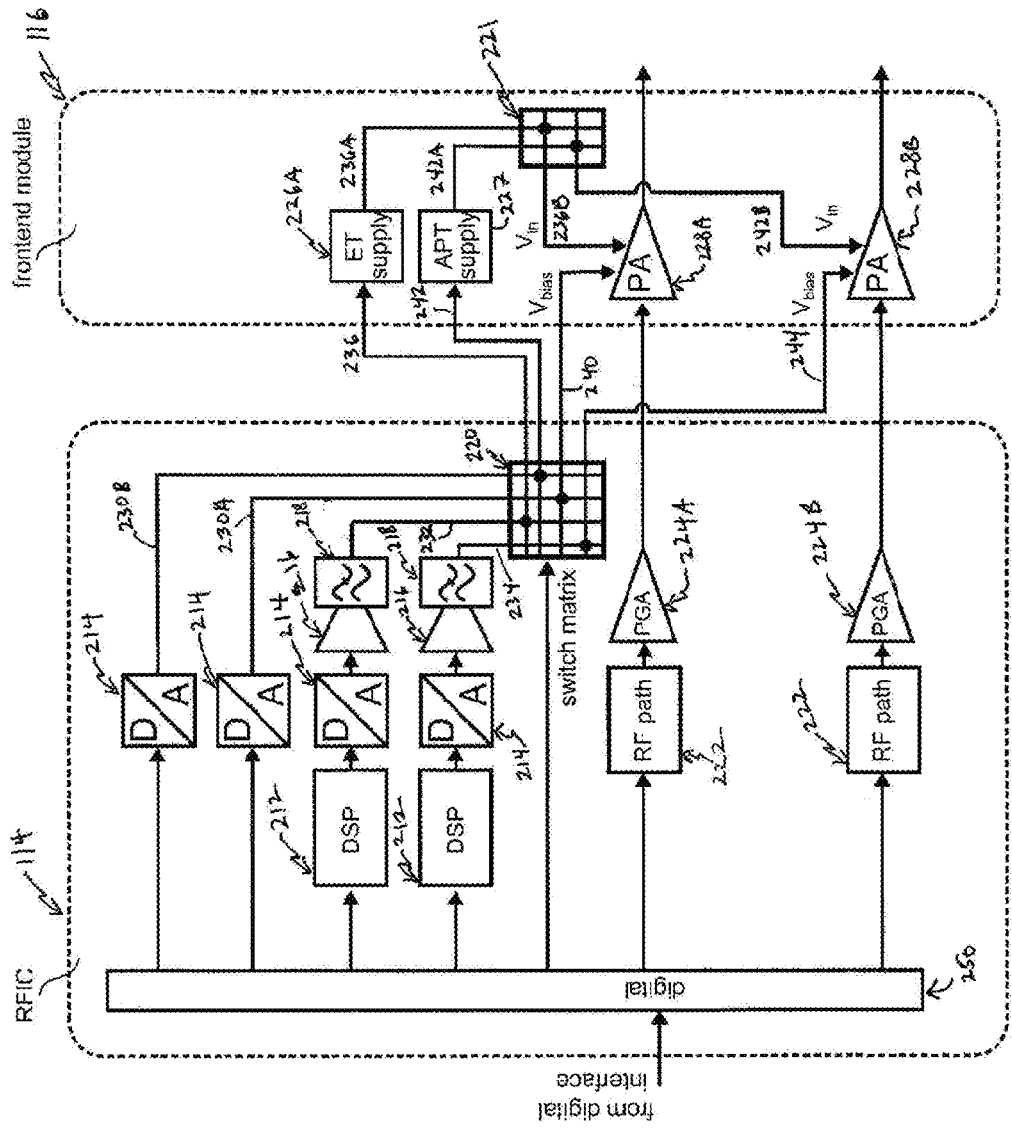
FIG. 2B depicts another example of an apparatus, in accordance with some example embodiments.

FIG. 2B depicts an example of another apparatus, in accordance with some example embodiments. The apparatus in FIG. 2B is similar to the apparatus in FIG. 2A but may include an additional DC voltage source and an additional switch matrix to switch an envelope tracking voltage supply and an average power tracking (APT) supply between the supply voltage inputs to two power amplifiers. An APT supply may be a voltage controlled voltage source with a lower control bandwidth than an envelope tracker. The description of FIG. 2B also refers to FIGS. 1 and 2A.

The first power amplifier 228A in FIG. 2B may have a bias voltage input 240 that is connected through switch matrix 220 to a voltage source such as DC voltage source 230A. The first power amplifier 228A may have a first supply voltage input 236B. In some example embodiments, switch matrix 221 may determine whether envelope tracker 226A or average power tracker 227 is connected to the supply voltage input 236B of power amplifier 228A. For example, switch matrix 221 may connect envelope tracker 226A to supply voltage input 236B. In some example embodiments, the envelope tracker 226A may be a voltage controlled voltage source. In some example embodiments, switch matrix 220 may determine which voltage source 230A, 230B, 232, and/or 234 is connected to input 236. By controlling the bias voltage input 240 and the supply voltage input 236B, the radio frequency output power of power amplifier 228A and the efficiency of power amplifier 228A may be controlled.

The second power amplifier 228B in FIG. 2B may have a bias voltage input 244 that is connected through switch matrix 220 to a voltage source such as AC voltage source 234. The second power amplifier 228B may have a second supply voltage input 242B. In some example embodiments, switch matrix 221 may determine whether envelope tracker 226A or average power tracker 227 is connected to the supply voltage input 242B of power amplifier 228B. For example, switch matrix 221 may connect average power tracker 227 to supply voltage input 242B. In some example embodiments, switch matrix 220 may determine which voltage source 230A, 230B, 232, and/or 234 is connected to input 242. In some example embodiments, the supply voltage input 242 may cause average power tracker 227 to generate the supply voltage for power amplifier 228B. In some example embodiments, the average power tracker 227 may be a voltage controlled voltage source. By controlling the bias voltage input 244 and the supply voltage input 242B, the radio frequency output power of power amplifier 228B and the efficiency of power amplifier 228B may be controlled.

In some example embodiments, switch matrix 221 may switch whether envelope tracker 226A is connected to the supply voltage input of power amplifier 228A, 228B, or both and whether the average power tracking supply 227 is connected to power amplifier 228A, 228B, or both.

In some example embodiments, more or fewer circuit components may be included than as depicted or described in the examples of FIGS. 2A and 2B (for example, more or fewer envelope trackers, average power trackers, switch matrices, and/or the like may be implemented in the circuitry depicted and described with respect to FIG. 2A or 2B).

RFIC and switch matrix 114 may include one or more voltage sources. The voltage sources may include one or more direct current (DC) voltage sources such as DC voltage sources 230A and 230B. The DC voltage may be produced by digital-to-analog converter 214. The voltage sources may include one or more alternating current (AC) voltage sources such as AC voltage sources 232 and 234. In some example embodiments, the voltage out of one or more of AC voltage sources 232/234 may be generated to track a power envelope of a radio frequency signal amplified by a power amplifier, or to track an average power. In some example embodiments, tracking the average power may be more slowly varying than tracking the power envelope of the signal amplified by an amplifier.

In some example embodiments, a means for amplifying a signal that has supply and bias voltage inputs may include power amplifiers and low noise amplifiers, as well as other amplifiers. The amplifiers may include radio frequency amplifiers, microwave amplifiers, millimeterwave amplifiers, audio amplifiers, optical amplifiers, or any other type of amplifier operating in any other frequency range. In some example embodiments, the apparatus provides a means for configuring a switch matrix to make connections between inputs and outputs. The switch matrix may be implemented in accordance with FIGS. 1, 2A and/or 2B. The switch matrix connections may be configured via a hardware control interface, or via messages or control signals sent over a digital interface.

Figure 3:
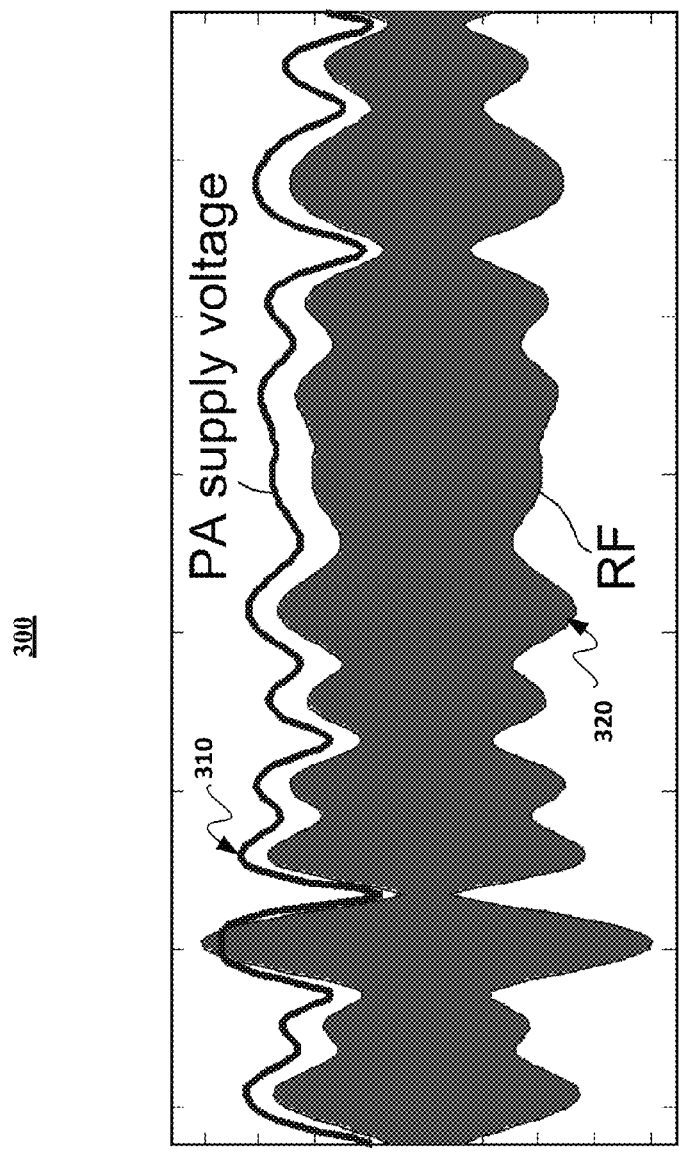
FIG. 3 depicts an example plot of a power envelope of a radio frequency signal, in accordance with some example embodiments.

FIG. 3 depicts an example plot of a power envelope of a radio frequency signal, in accordance with some example embodiments. The plot 320 is representative of an envelope of a radio frequency signal as a function of time. The plot at 310 is representative of a power amplifier supply voltage that tracks the power in the envelope 320. In some example embodiments, AC sources 232 and/or 234 may track a power envelope in a signal for transmission such as the signal between 224A and 228A and/or the signal between 224B and 228B in a manner similar to the tracking of 310 to 320.

Figure 4:
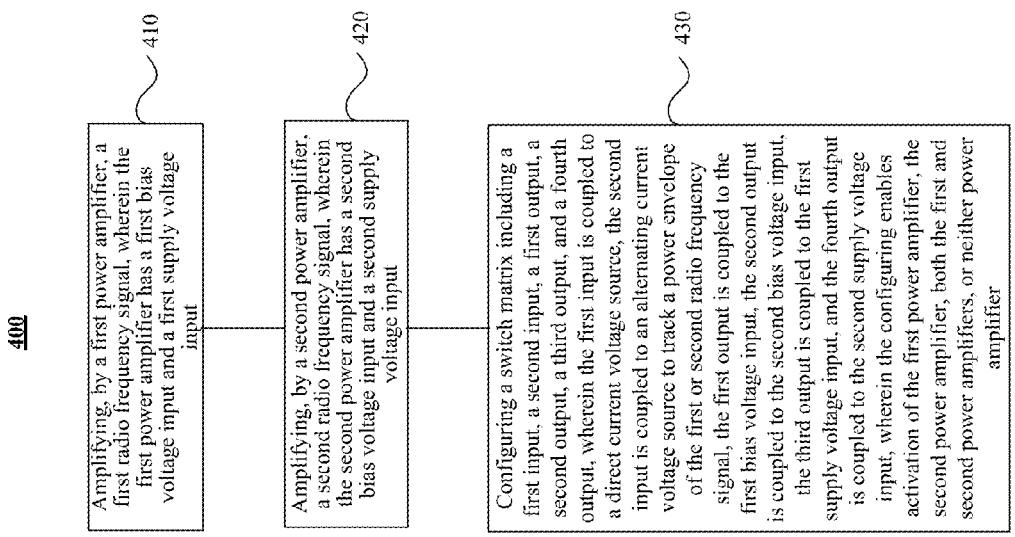
FIG. 4 depicts an example of a process, in accordance with some example embodiments.

FIG. 4 depicts an example of a process, in accordance with some example embodiments. At 410, a first power amplifier may be selected. At 420, a second power amplifier may be selected. At 430, connections from one or more source voltages to bias and supply inputs for the first and second power amplifiers may be selected or configured. The description of FIG. 4 also refers to FIGS. 1 and 2.

At 410, a first power amplifier with a first bias voltage input and a first supply voltage input may be selected. For example, the first power amplifier such as power amplifier 228A may be selected based on a communications protocol, frequency band, or radio frequency transmit power level for a radio frequency signal to be amplified by the first power amplifier for transmission by an antenna such as antenna 118.

At 420, a second power amplifier with a second bias voltage input and a second supply voltage input may be selected. For example, the second power amplifier such as power amplifier 228B may be selected based on a communications protocol, frequency band, and or radio frequency transmit power level for a radio frequency signal to be amplified by the second power amplifier for transmission by an antenna such as antenna 118.

At 430, connections made by a switch matrix such as switch matrix 220 may be selected. In some example embodiments, the connections may be selected between inputs to the switch matrix and outputs from the switch matrix. The inputs may include an adjustable direct current voltage source and/or an alternating current (AC) voltage. In some example embodiments, an AC voltage source may track a power envelope of a radio frequency signal to be amplified by the first power amplifier and/or the second power amplifier. For example, the AC voltage source may track the power envelope of the signal provided by a variable gain amplifier such as 224A to a power amplifier such as 228A. The power envelope tracking may include digital signal processor 212, digital to analog converter 214 and filter 216, operating to provide the AC voltage source 234 that tracks or is proportional to the power in the signal provided by variable gain amplifier 224B to power amplifier 228B. In some example embodiments the AC voltage source may track other factors affecting communications using the selected communication protocol such as tracking multipath fading of the signal transmitted by the power amplifier. Other factors may also be tracked. The outputs of the switch matrix may comprise an output for the first bias voltage input, an output for the second bias voltage input, an output for the first supply voltage input, and an output for the second supply voltage input. The connections between the inputs and the outputs may be selected by configuring the switch matrix in accordance with the foregoing description in FIG. 2A.

Figure 5:
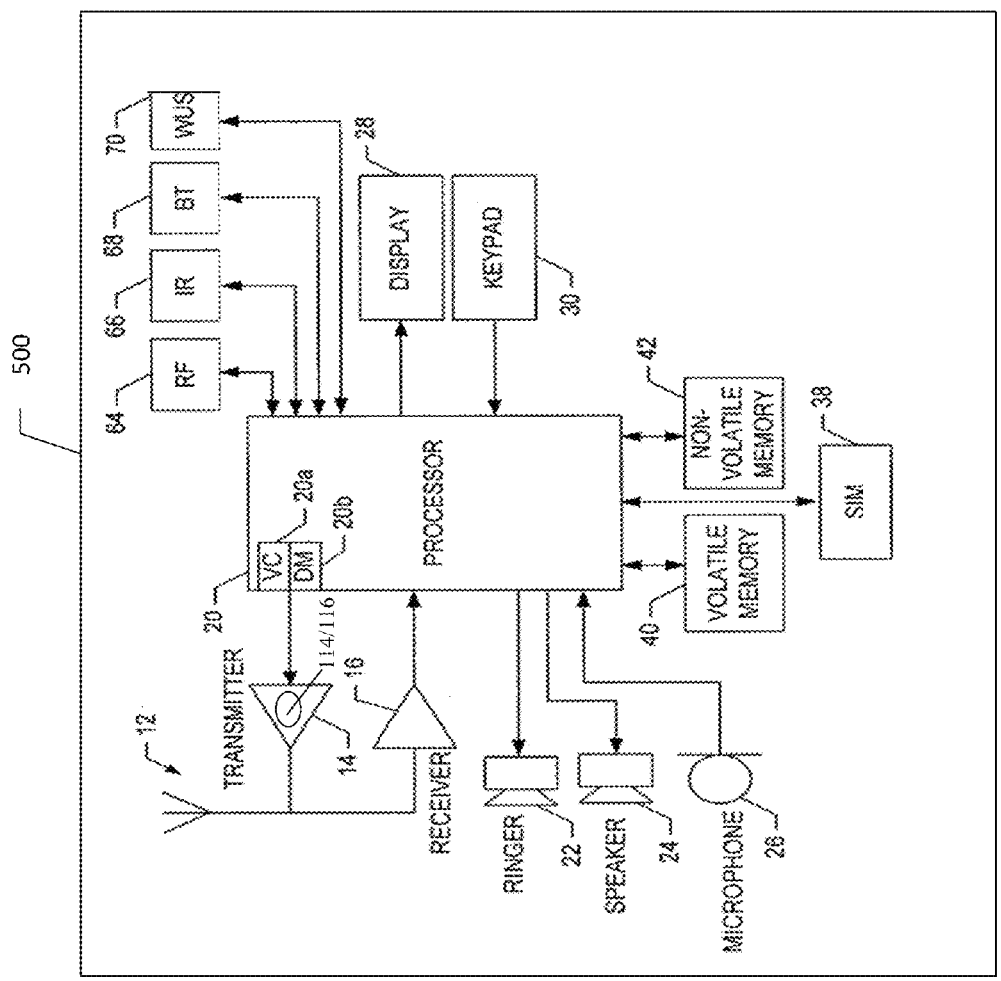
FIG. 5 depicts an example of an apparatus, in accordance with some example embodiments.

FIG. 5 depicts an example of an apparatus 500, in accordance with some example embodiments. Apparatus 500 may include signal processor 112, RFIC and switch matrix 114, and/or front end 116. RFIC and switch matrix 114 and front end 116 consistent with FIGS. 1-4 may be included in transmitter 14. RFIC and switch matrix 114 and front end 116 consistent with FIGS. 1-4 may also be included in a short-range radio frequency transceiver 64 and/or Bluetooth transceiver 68. RFIC and switch matrix 114 and front end 116 consistent with FIGS. 1-4 may also be included in a base station or access point such as base station/access point 120.

In some example embodiments, apparatus 500 may also include a radio communication link to a cellular network, or other wireless network. The apparatus 500 may include at least one antenna 12 in communication with a transmitter 14 and a receiver 16. Alternatively transmit and receive antennas may be separate.

The apparatus 500 may also include a processor 20 configured to provide signals to and from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 500 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Apparatus 500 may include a location processor and/or an interface to obtain location information, such as positioning and/or navigation information. Accordingly, although illustrated in FIG. 5 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as, Institute of Electrical and Electronics Engineers (IEEE) 802.11, 802.16, and/or the like. In addition, these signals may include speech data, user generated data, user requested data, and/or the like.

The apparatus 500 may be capable of operating with one or more air interface standards, communication protocols, modulation types, access types, and/or the like. For example, the apparatus 500 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 500 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 500 may be capable of operating in accordance with 2.5G wireless communication protocols General Packet Radio Service (GPRS), Enhanced Data GSM Environment (EDGE), and/or the like. Further, for example, the apparatus 500 may be capable of operating in accordance with 3G wireless communication protocols, such as, Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 500 may be additionally capable of operating in accordance with 3.9G wireless communication protocols, such as, Long Term Evolution (LTE), Evolved Universal Terrestrial Radio Access Network (E-UTRAN), and/or the like. Additionally, for example, the apparatus 500 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 500. For example, the processor 20 may comprise a digital signal processor device, a microprocessor device, an analog-to-digital converter, a digital-to-analog converter, and/or the like. Control and signal processing functions of the apparatus 500 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 500 to perform actions. For example, processor 20 may be capable of operating a connectivity program, such as, a web browser. The connectivity program may allow the apparatus 500 to transmit and receive web content, such as location-based content, according to a protocol, such as, wireless application protocol, WAP, hypertext transfer protocol, HTTP, and/or the like.

Apparatus 500 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as, the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 500 may include a battery for powering various circuits related to the mobile terminal, for example, a circuit to provide mechanical vibration as a detectable output. The user input interface may comprise devices allowing the apparatus 500 to receive data, such as, a keypad 30 (which can be a virtual keyboard presented on display 28 or an externally coupled keyboard) and/or other input devices.

Moreover, the apparatus 500 may include a short-range radio frequency (RF) transceiver and/or interrogator 64, so data may be shared with and/or obtained from electronic devices in accordance with RF techniques. The apparatus 500 may include other short-range transceivers, such as an infrared (IR) transceiver 66, a Bluetooth (BT) transceiver 68 operating using Bluetooth wireless technology, a wireless universal serial bus (USB) transceiver 70, and/or the like. The Bluetooth transceiver 68 may be capable of operating according to low power or ultra-low power Bluetooth technology, for example, Wibree, radio standards. In this regard, the apparatus 500 and, in particular, the short-range transceiver may be capable of transmitting data to and/or receiving data from electronic devices within a proximity of the apparatus, such as within 10 meters. The apparatus 500 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 500 may comprise memory, such as, a subscriber identity module (SIM) 38, a removable user identity module (R-UIM), and/or the like, which may store information elements related to a mobile subscriber. In addition to the SIM, the apparatus 500 may include other removable and/or fixed memory. The apparatus 500 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as an international mobile equipment identification (IMEI) code, capable of uniquely identifying apparatus 500. The functions may include one or more of the operations disclosed herein including the process flow of FIG. 4, and the like. The memories may comprise an identifier, such as, an international mobile equipment identification (IMEI) code, capable of uniquely identifying apparatus 500. In the example embodiment, the processor 20 may be configured using computer code stored at memory 40 and/or 42 to provide the operations disclosed with respect to the processes described with respect to FIG. 4, and the like.

Some of the embodiments disclosed herein may be implemented in software, hardware, application logic, or a combination of software, hardware, and application logic. The software, application logic, and/or hardware may reside in memory 40, the processor 20, or electronic components disclosed herein, for example. In some example embodiments, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry. A computer-readable medium may comprise a non-transitory computer-readable storage medium that may be any media that can contain or store the instructions for use by or in connection with an instruction execution system, apparatus, or device, such as a computer. Furthermore, some of the embodiments disclosed herein include computer programs configured to cause methods as disclosed herein (see, for example, the process 400).

The subject matter described herein may be embodied in systems, apparatus, methods, and/or articles depending on the desired configuration. For example, the systems, apparatus, methods, and/or articles described herein can be implemented using one or more of the following: electronic components such as transistors, inductors, capacitors, resistors, and the like, a processor executing program code, an application-specific integrated circuit (ASIC), a digital signal processor (DSP), an embedded processor, a field programmable gate array (FPGA), and/or combinations thereof. These various example embodiments may include implementations in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Without in any way limiting the scope, interpretation, or application of the claims appearing below, a technical effect of one or more of the example embodiments disclosed herein is to improve the power efficiency of wireless terminals and/or base stations operating in multiple frequency bands and to provide reconfigurable control of bias and power supply inputs to power amplifiers.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

What is claimed:

1. An apparatus comprising:
a direct current voltage source;
an alternating current voltage source to track a power envelope of a first radio frequency signal or a second radio frequency signal;
a first power amplifier to amplify the first radio frequency signal, wherein the first power amplifier has a first bias voltage input and a first supply voltage input;
a second power amplifier to amplify the second radio frequency signal, wherein the second power amplifier has a second bias voltage input and a second supply voltage input; and
a switch matrix including a first input, a second input, a first output, a second output, a third output, and a fourth output,
wherein the first input is coupled to the direct current voltage source, the second input is coupled to the alternating current voltage source, the first output is coupled to the first bias voltage input, the second output is coupled to the second bias voltage input, the third output is coupled to the first supply voltage input, and the fourth output is coupled to the second supply voltage input,
wherein the switch matrix is configured to control an envelope-tracked signal provided, at the same time, to the first supply voltage input and the second supply voltage input, and
wherein a configuration of the switch matrix enables activation of the first power amplifier, the second power amplifier, both the first and second power amplifiers, or neither power amplifier.

2. The apparatus of claim 1, wherein the power consumption of the apparatus is reduced when the switch matrix is configured to connect the alternating current voltage source to the first supply voltage input of the first power amplifier, and wherein the alternating current voltage source tracks the power envelope of the first radio frequency signal amplified by the first power amplifier.

3. The apparatus of claim 2, wherein the power consumption of the apparatus is reduced when the switch matrix is configured to not connect one or more of the bias voltage input and the supply voltage input of the second power amplifier to either the alternating current voltage source or the direct current voltage source.

4. The apparatus of claim 2, wherein the switch matrix is configured to connect the bias voltage input of the first power amplifier and the bias voltage input of the second power amplifier to the direct current voltage source.

5. The apparatus of claim 1, wherein the switch matrix is configured to connect the bias voltage input of the first power amplifier to the alternating current voltage source.

6. The apparatus of claim 1, wherein the first supply voltage input or the second supply voltage input control a power supply for the first power amplifier or the second power amplifier, wherein the power supply includes at least one of an envelope tracking modulator, a switched mode direct current to direct current converter, or a low-dropout linear voltage regulator.

7. The apparatus of claim 1, wherein the switch matrix is configured based on at least one of:
a bandwidth;
a contiguous or a non-contiguous multicarrier configuration;
a transmit power;
an operating mode;
a modulation and coding configuration; or
a signal reflection coefficient of a transmission antenna.

8. A method comprising:
amplifying, by a first power amplifier, a first radio frequency signal, wherein the first power amplifier has a first bias voltage input and a first supply voltage input;
amplifying, by a second power amplifier, a second radio frequency signal, wherein the second power amplifier has a second bias voltage input and a second supply voltage input; and
configuring a switch matrix including a first input, a second input, a first output, a second output, a third output, and a fourth output,
wherein the first input is coupled to a direct current voltage source, the second input is coupled to an alternating current voltage source to track a power envelope of the first or second radio frequency signal, the first output is coupled to the first bias voltage input, the second output is coupled to the second bias voltage input, the third output is coupled to the first supply voltage input, and the fourth output is coupled to the second supply voltage input,
wherein the switch matrix is configured to control an envelope-tracked signal provided, at the same time, to the first supply voltage input and the second supply voltage input, and wherein the configuring enables activation of the first power amplifier, the second power amplifier, both the first and second power amplifiers, or neither power amplifier.

9. The method of claim 8, wherein the power consumption of the apparatus is reduced when the switch matrix is configured to connect the alternating current voltage source to the first supply voltage input of the first power amplifier, and wherein the alternating current voltage source tracks the power envelope of the first radio frequency signal amplified by the first power amplifier.

10. The method of claim 9, wherein the power consumption of the apparatus is reduced when the switch matrix is configured to not connect one or more of the bias voltage input and the supply voltage input of the second power amplifier to either the alternating current voltage source or the direct current voltage source.

11. The method of claim 9, wherein the switch matrix is configured to connect the bias voltage input of the first power amplifier and the bias voltage input of the second power amplifier to the direct current voltage source.

12. The method of claim 8, wherein the switch matrix is configured to connect the bias voltage input of the first power amplifier to the alternating current voltage source.

13. The method of claim 8, wherein the first supply voltage input or the second supply voltage input control a power supply for the first power amplifier or the second power amplifier, wherein the power supply includes at least one of an envelope tracking modulator, a switched mode direct current to direct current converter, or a low-dropout linear voltage regulator.

14. The method of claim 8, wherein the switch matrix is configured based on at least one of:
 a bandwidth;
 a contiguous or a non-contiguous multicarrier configuration;
 a transmit power;
 an operating mode;
 a modulation and coding configuration; or
 a signal reflection coefficient of a transmission antenna.

15. A non-transitory computer-readable medium encoded with instructions that, when executed by at least one processor, cause operations comprising:
 amplifying, by a first power amplifier, a first radio frequency signal, wherein the first power amplifier has a first bias voltage input and a first supply voltage input;
 amplifying, by a second power amplifier, a second radio frequency signal, wherein the second power amplifier has a second bias voltage input and a second supply voltage input; and
 configuring a switch matrix including a first input, a second input, a first output, a second output, a third output, and a fourth output,
 wherein the first input is coupled to a direct current voltage source, the second input is coupled to an alternating current voltage source to track a power envelope of the first or second radio frequency signal, the first output is coupled to the first bias voltage input, the second output is coupled to the second bias voltage input, the third output is coupled to the first supply voltage input, and the fourth output is coupled to the second supply voltage input,
 wherein the switch matrix is configured to control an envelope-tracked signal provided, at the same time, to the first supply voltage input and the second supply voltage input, and
 wherein the configuring enables activation of the first power amplifier, the second power amplifier, both the first and second power amplifiers, or neither power amplifier.

16. The non-transitory computer-readable medium of claim 15, wherein the power consumption of the apparatus is reduced when the switch matrix is configured to connect the alternating current voltage source to the first supply voltage input of the first power amplifier, and wherein the alternating current voltage source tracks the power envelope of the first radio frequency signal amplified by the first power amplifier.

17. The non-transitory computer-readable medium of claim 15, wherein the switch matrix is configured to connect the bias voltage input of the first power amplifier to the alternating current voltage source.

18. The non-transitory computer-readable medium of claim 15, wherein the first supply voltage input or the second supply voltage input control a power supply for the first power amplifier or the second power amplifier, wherein the power supply includes at least one of an envelope tracking modulator, a switched mode direct current to direct current converter, or a low-dropout linear voltage regulator.

19. The non-transitory computer-readable medium of claim 15, wherein the switch matrix is configured based on at least one of:
 a bandwidth;
 a contiguous or a non-contiguous multicarrier configuration;
 a transmit power;
 an operating mode;
 a modulation and coding configuration; or
 a signal reflection coefficient of a transmission antenna.

20. The apparatus of claim 1, wherein the alternating current voltage source comprises a filter, wherein the filter is configured to a wide bandwidth when the switch matrix connects the second input to the first output, and wherein the filter is configured to a narrow bandwidth when the switch matrix connects the second input to the third output.

21. The apparatus of claim 1, further comprising:
 a first envelope tracker coupled to the first supply voltage input and configured to provide a first envelope-tracked signal; and
 a second envelope tracker coupled to the second supply voltage input and configured to provide a second envelope-tracked signal, wherein the envelope-tracked signal provided to the first and second supply voltage input at the same time comprises the first envelope-tracked signal and the second envelope-tracked signal.

* * * * *